United States Patent [19]
Kim et al.

[11] Patent Number: 5,801,085
[45] Date of Patent: Sep. 1, 1998

[54] METHOD FOR THE PREVENTION OF MISFIT DISLOCATION IN SILICON WAFER AND SILICON STRUCTURE MANUFACTURED THEREBY

[75] Inventors: Choong Ki Kim, Seoul; Chul Hi Han; Ho Jun Lee, both of Daejeon, all of Rep. of Korea

[73] Assignee: Korea Advanced Institute of Science and Technology, Rep. of Korea

[21] Appl. No.: 535,454

[22] Filed: Sep. 28, 1995

Related U.S. Application Data

[62] Division of Ser. No. 383,919, Feb. 6, 1995, abandoned.

[30] Foreign Application Priority Data

Feb. 7, 1994 [KR] Rep. of Korea .................. 1994-2223

[51] Int. Cl.$^6$ .................................. H01L 21/425
[52] U.S. Cl. .................................. 438/524; 438/938
[58] Field of Search .................. 437/38, 95, 97, 437/976, 68; 148/DIG. 7, DIG. 97; 438/524, 938

[56] References Cited

U.S. PATENT DOCUMENTS 4,137,103 1/1979 Mader et al. .................. 437/976
4,786,614 11/1988 Cogan .................. 437/68

Primary Examiner—Chandra Chaudhari
Attorney, Agent, or Firm—Morgan & Finnegan, LLP

[57] ABSTRACT

There are disclosed methods for the prevention of misfit dislocation in a silicon wafer and the silicon wafer structure manufactured thereby. A method according to an embodiment comprises the steps of: depositing a blanket silicon oxide or silicon nitride on silicon wafer in a chemical vapor deposition process; selectively etching the silicon oxide or silicon nitride, to form a silicon oxide or silicon nitride pattern which is of close shape; and injecting the silicon wafer with impurities at a high density with the CVD silicon oxide or silicon nitride pattern serving as a mask, so as to form an impurity-blocked region is formed under the CVD silicon oxide or silicon nitride through the action of the mask. The misfit dislocation is propagated mainly from the edge of wafer and an impurity-blocked region can prevent the propagation. The propagation energy is virtually based on the tensile stress attributable to the implantation of impurity. Formation of an impurity-blocked region in the wafer barricades the propagation of misfit dislocation because the propagation energy is not supplied in this region. Thus, the area of the silicon wafer enclosed by the impurity-blocked region has no misfit dislocation. By such conception, a silicon wafer free of misfit dislocation can be manufactured. Therefore, there are improved in electrical and mechanical properties in electrical devices, X-ray masks and micromachines as well as in surface roughness.

3 Claims, 4 Drawing Sheets

METHOD FOR THE PREVENTION OF MISFIT DISLOCATION IN SILICON WAFER AND SILICON STRUCTURE MANUFACTURED THEREBY

This is a divisional of application Ser. No. 08/383,919 filed Feb. 6, 1995, and now abandoned.

BACKGROUND OF THE INVENTION

Field of the invention

The present invention relates to structures preventive of the dislocation which is generated when dopants are injected at high densities into a silicon wafer. Also, the present invention is concerned with fabrication methods thereof.

It is usually required to inject dopants at high densities in order to form the burial and isolation region of bipolar transistor, emitter and collector, or the source and drain of FET. In addition, an etch stopper, which is indispensable to the manufacture of silicon thin films for X-ray mask, micromachines and bonding wafers, also requires the injection of dopants at high densities. However, boron or phosphorous, both smaller than silicon atom, is not injected at high densities without causing a defect called misfit dislocation. The misfit dislocation is directly attributed to a fact that the silicon lattice is reduced in efficient size when silicon is substituted by small boron or phosphorous. Accordingly, the layer doped with boron or phosphorous has a large tensile stress to which the misfit dislocation is generated owing. Particularly, this misfit dislocation is serious around junction portions, so that junction leakage current is caused in electrical devices, deleteriously affecting their electrical properties. In addition, the misfit dislocation gives rise to increasing surface roughness in the etch stopper, so that the fracture strength and fatigue resistance of the X-ray mask or the micromachine are reduced and the surface roughness of the junction wafer is deteriorated.

Presently, X-ray masks, micromachines and junction wafers have been manufactured with poor surface roughness in the etch stopper or electrical devices are fabricated with low densities of dopants, because the misfit dislocation which always appears upon injecting dopants at high densities is not eliminated.

The present inventors have recognized that the misfit dislocation is propagated mainly from the edge of wafer and an impurity-blocked region can prevent the propagation. The propagation energy is virtually based on the tensile stress attributable to the injection of impurity. Formation of an impurity-blocked region in the wafer barricades the propagation of misfit dislocation because the propagation energy is not supplied in this region. Accordingly, the area of the silicon wafer enclosed by the impurity-blocked region has no misfit dislocation. By such inventive conception, a silicon wafer free of misfit dislocation can be manufactured. Therefore, the electrical devices can be improved in electrical properties, the X-ray masks and micromachines is superior in mechanical properties, and the junction wafers has small surface roughness.

SUMMARY OF THE INVENTION

Therefore, an object of the present invention is to overcome the above problems encountered in prior arts and to provide methods for the prevention of misfit dislocation in a silicon wafer.

Another object of the present invention is to provide wafer structures free of the misfit dislocation.

In accordance with a first aspect of the present invention, there is a provided a method for the prevention of misfit dislocation in a silicon wafer, comprising the steps of: depositing a blanket silicon oxide or silicon nitride on silicon wafer in a chemical vapor deposition process; subjecting the silicon oxide or silicon nitride to selective etch, to form a silicon oxide or silicon nitride pattern which is of close shape; and injecting the silicon wafer with impurities at a high density with the CVD silicon oxide or silicon nitride pattern serving as a mask, so as to form an impurity-blocked region is formed under the CVD silicon oxide or silicon nitride through the action of the mask.

In accordance with a second aspect of the present invention, there is provided a method for the prevention of misfit dislocation in a silicon wafer, comprising the steps of: depositing a blanket silicon oxide or silicon nitride on silicon wafer in a chemical vapor deposition process; subjecting the silicon oxide or silicon nitride to selective etch to expose an area of the silicon wafer which is of close shape; etching the exposed area of the silicon wafer by use of a chemical etchant, to form a groove in the silicon wafer; selectively etching the remaining silicon oxide or silicon nitride by use of a mask, to form a silicon oxide or silicon nitride pattern which is of close shape, along the close groove; and injecting impurities at a high density into the silicon wafer with the CVD silicon oxide or silicon nitride pattern serving as a mask, so as to form an impurity-blocked region under the silicon oxide or silicon nitride through the action of the mask.

In accordance with a third aspect of the present invention, there is provided a method for the prevention of misfit dislocation in a silicon wafer, comprising the steps of: depositing a blanket silicon oxide or silicon nitride on silicon wafer in a chemical vapor deposition process; subjecting the silicon oxide or silicon nitride to selective etch to expose an area of the silicon wafer which is of close shape; etching the exposed area of the silicon wafer with a chemical etchant to form a groove in the silicon wafer; eliminating the remaining silicon oxide or silicon nitride completely; depositing another blanket silicon oxide over the silicon wafer in a chemical vapor deposition process; selectively etching the silicon oxide or silicon nitride by use of a mask, to form a silicon oxide or silicon nitride pattern which covers an area including the groove; and injecting impurities at a high density into the silicon wafer with the silicon oxide or silicon nitride pattern serving as a mask, so as to form an impurity-blocked region under the silicon oxide or silicon nitride through the action of the mask.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1A:
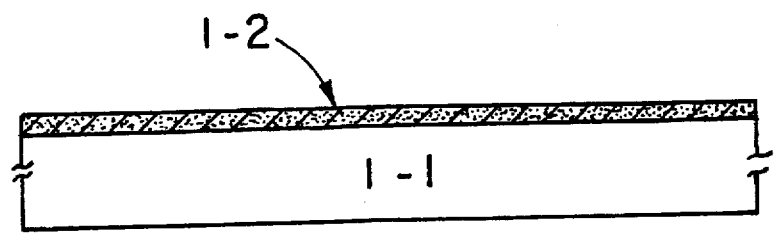
FIGS. 1A through 1C are schematic cross sectional views illustrating a method for the prevention of misfit dislocation in a wafer, according to a first embodiment of the present invention.

The application of the preferred embodiments of the present invention is best understood with reference to the accompanying drawings, wherein like reference numerals are used for like and corresponding parts, respectively.

Figure 1B:
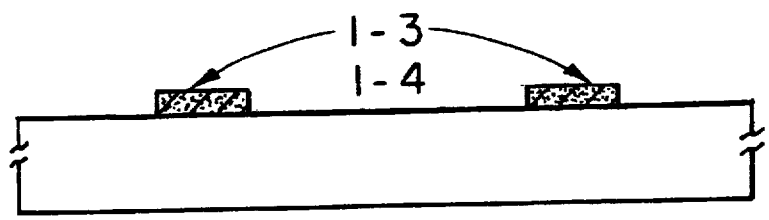
Figure 1C:
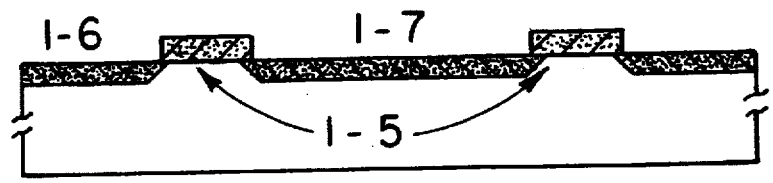

FIG. 1 shows the preferred process steps for the prevention of misfit dislocation in a silicon wafer, according to a first embodiment of the present invention. These preferred process steps will be in great detail described in connection with FIGS. 1A through 1C.

First, on a (100) silicon wafer 1-1 is deposited a 1 μm thick silicon oxide or silicon nitride 1-2 by use of a chemical vapor deposition (hereinafter referred to as "CVD") process, as shown in FIG. 1A.

FIG. 1B is a cross section after the CVD silicon oxide or silicon nitride 1-2 is subjected to selective etch, to form a CVD silicon oxide or silicon nitride pattern 1-3 which is of closed shape forming a continuous perimeter of 100 μm width to produce a region 1-4 within the perimeter.

It is the region 1-4 enclosed by the CVD silicon oxide or silicon nitride pattern 1-3 that should be free of the misfit dislocation. In practice, the region 1-4 of the silicon wafer has an area of about 4 cm$^2$. When the CVD silicon oxide or silicon nitride pattern 1-3 is rectangular, each of the sides of the CVD silicon oxide or silicon nitride pattern 1-3 is aligned parallel to the direction of [110] or [110] as shown in FIG. 2A.

FIG. 1C is a cross section after impurities, for example, boron ions are injected at a density of about $2\times10^{20}$/cm$^3$ with 4 μm deep into the silicon wafer by thermal diffusion at a temperature of 1,100° C. for about 5 hours, with the CVD silicon oxide or silicon nitride pattern 1-2 serving as a mask. As shown in this figure, an impurity-blocked region 1-5 is formed under the CVD silicon oxide or silicon nitride 1-3 through the action of the mask.

There is generated the misfit dislocation in the impurity-injected region 1-6 which is not enclosed by the impurity-blocked region 1-4. On the contrary, nowhere is the misfit dislocation in the impurity-injected region 1-7 enclosed by the impurity-blocked region 1-4. This is attributed to a fact that the propagation of the misfit dislocation from the edge to the central portion is prevented by the impurity-blocked region 1-4. Thus, there is provided a superior impurity-injected layer.

Figures 2A, 2B:
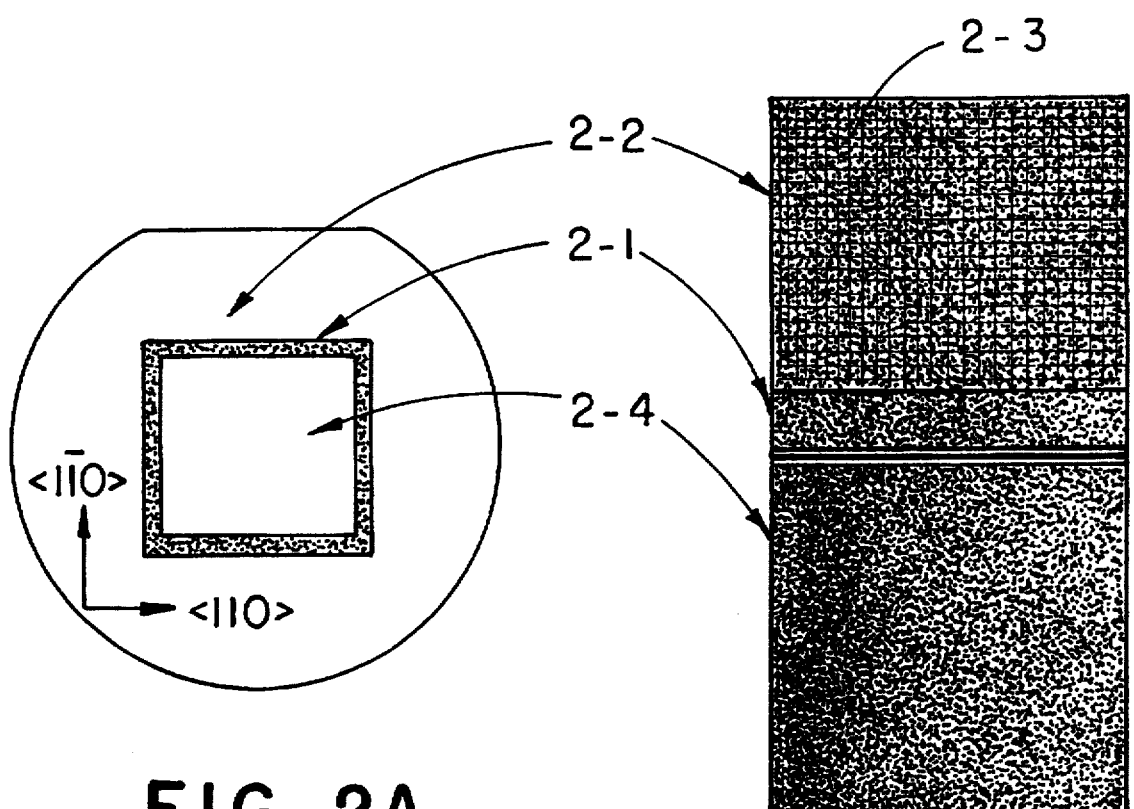
FIG. 2A is a plane view showing a silicon wafer free of misfit dislocation.
FIG. 2B is a magnified electron microscopic photograph showing a part of FIG. 2A.

With reference to FIG. 2A, there is a plan view after the silicon wafer of FIG. 1C is subjected to defect etch. FIG. 2B is a magnified electron microscopic photograph of FIG. 2A showing an impurity-blocked region 2-1, an open, impurity-injected region 2-2, which is not enclosed by the impurity-blocked region 2-1, and an closed, impurity-injected region 2-4, which is enclosed by the impurity-blocked region 2-1. As apparent from this photograph, the open, impurity-injected region 2-2 has a great quantity of intercrossed, misfit dislocation 2-3 whereas the close, impurity-injected region 2-4 has no misfit dislocation.

With reference to FIG. 3, there are illustrated the preferred process steps for the prevention of misfit dislocation in a silicon wafer, according to a second embodiment of the present invention. These preferred process steps will be in great detail described in connection with FIGS. 3A through 3D.

Figure 3A:
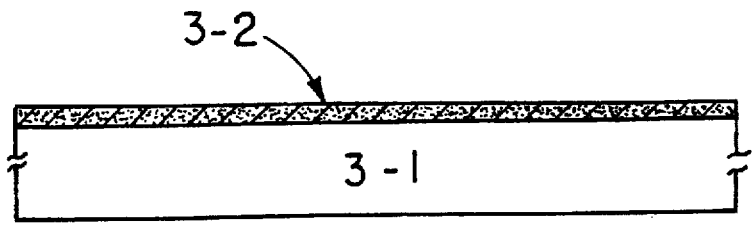
FIGS. 3A through 3D are schematic cross sectional views illustrating a method for the prevention of misfit dislocation in a wafer, according to a second embodiment of the present invention.

First, on a (100) silicon wafer 3-1 is deposited a 1 μm thick silicon oxide or silicon nitride 3-2 by use of a CVD process, as shown in FIG. 3A.

Figure 3B:
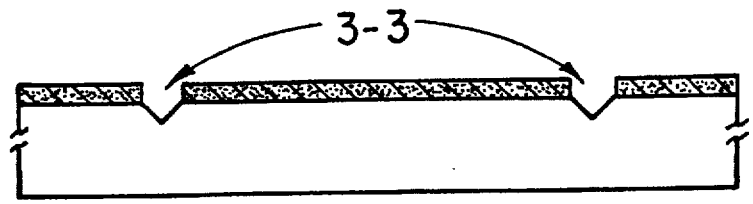

FIG. 3B is a cross section after the CVD silicon oxide or silicon nitride 3-2 is subjected to selective etch to expose an area of the silicon wafer which is of closed, continuous perimeter shape and of 10 μm width, followed by wet etch of the exposed area of the silicon wafer to form a closed, continuous perimeter groove 3-3 in the silicon wafer 3-1, which is about 10 μm deep. Upon the wet etch, a potassium hydroxide (KOH) solution may be used as a chemical etchant.

Figure 3C:
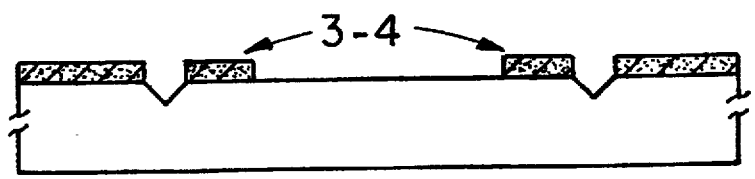

FIG. 3C is a cross section after the remaining CVD silicon oxide or silicon nitride is selectively etched by use of a mask, to form a CVD silicon oxide or silicon nitride pattern 3-4 which is about 20 μm wide and is of closed, continuous perimeter shape, along the close groove 3-3.

Figure 3D:
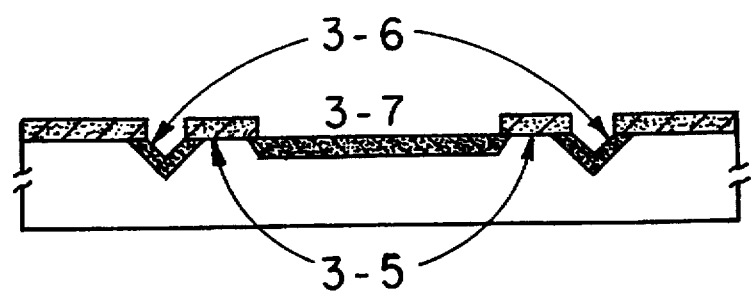

Thereafter, FIG. 3D is a cross section after impurities, for example, boron ions are injected at a density of about $2\times10^{20}$/cm$^3$ with 4 μm deep into the silicon wafer by thermal diffusion at a temperature of 1,100° C. for about 5 hours, with the CVD silicon oxide or silicon nitride pattern 3-4 serving as a mask. As shown in this figure, an impurity-blocked region 3-5 is formed under the CVD silicon oxide or silicon nitride 3-4 through the action of the mask.

It is the region 3-7 enclosed by the impurity-blocked region 3-5 that should be free of the misfit dislocation. In practice, the region 3-7 of the silicon wafer has an area of about 4 cm$^2$. When the CVD silicon oxide or silicon nitride pattern 3-4 is rectangular, each of the sides of the CVD silicon oxide or silicon nitride pattern 3-4 is aligned parallel to the direction of [110] or [110].

There is generated the misfit dislocation in the impurity-implanted region 3-6 which is not enclosed by the impurity-blocked region 3-5. On the contrary, nowhere is the misfit dislocation in the impurity-injected region 3-7 enclosed by the impurity-blocked region 3-5. Thus, there is provided a superior impurity-injected layer.

Turning now to FIG. 4, there are illustrated the preferred process steps for the prevention of misfit dislocation in a silicon wafer, according to a third embodiment of the present invention. These preferred process steps will be in great detail described in connection with FIGS. 4A through 4E.

Figure 4A:
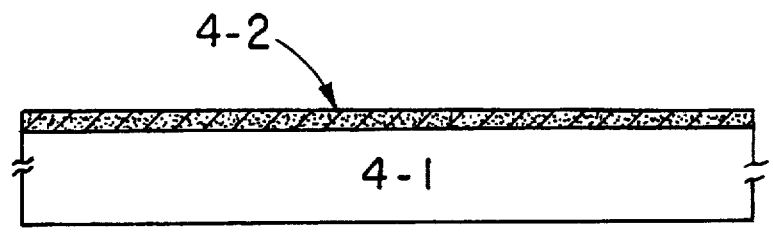
FIGS. 4A through 4E are schematic cross sectional views illustrating a method for the prevention of misfit dislocation in a wafer, according to a third embodiment of the present invention.

First, on a (100) silicon wafer 4-1 is deposited a 1 μmm thick silicon oxide or silicon nitride 4-2 by use of a CVD process, as shown in FIG. 4A.

Figure 4B:
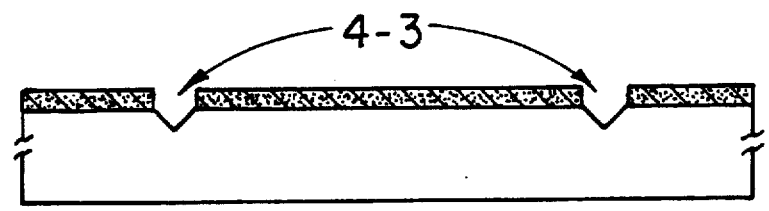

Next, FIG. 4B is a cross section after the CVD silicon oxide or silicon nitride 4-2 is subjected to selective etch to expose an area of the silicon wafer which is of closed, continuous perimeter shape and of 10 μm width, followed by wet etch of the exposed area of the silicon wafer to form a closed, continuous perimeter groove 4-3 in the silicon wafer 4-1, which is about 10 μm deep. Upon the wet etch, a potassium hydroxide (KOH) solution may be used as a chemical etchant.

Figure 4C:
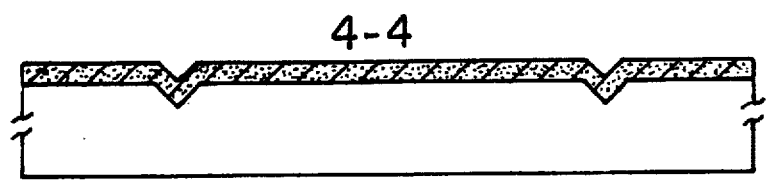

FIG. 4C is a cross section after the remaining CVD silicon oxide or silicon nitride is eliminated, followed by formation of a blanket CVD silicon oxide or silicon nitride 4-4 over the silicon wafer 4-1.

Figure 4D:
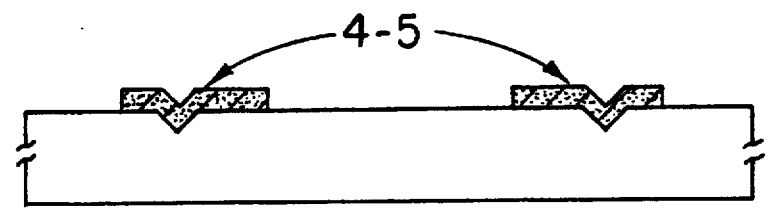

Thereafter, FIG. 4D is a cross section after the CVD silicon oxide or silicon nitride 4-4 is selectively etched by use of a mask, to form a CVD silicon oxide or silicon nitride pattern 4-5 which is about 100 μm wide and covers an area including the groove 4-3.

Figure 4E:
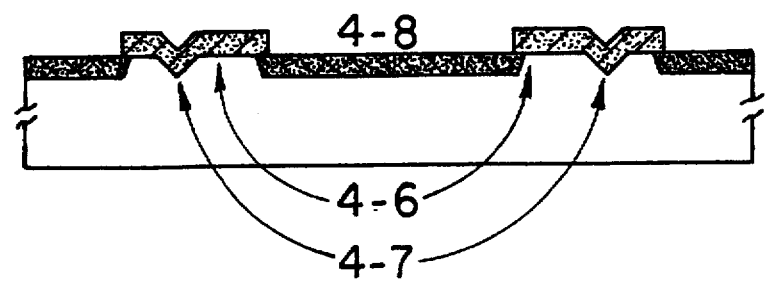

Finally, FIG. 4E is a cross section after impurities, for example, boron ions are injected at a density into the silicon wafer and subjected to annealing at a temperature of 1,100° C. for about 5 hours, to form an impurity layer which is about 4 μm deep, with the CVD silicon oxide or silicon nitride pattern 4-5 serving as a mask. As shown in this figure, an impurity-blocked region 4-6 with a width of about 10 μm is formed under the CVD silicon oxide or silicon nitride 4-5 through the action of the mask.

It is the region 4-8 enclosed by the impurity-blocked region 4-6 that should be free of the misfit dislocation. In practice, the region 4-8 of the silicon wafer has an area of about 4 cm². When the impurity-blocked region 4-6 is rectangular, each of the sides of the impurity-blocked region 4-6 is aligned parallel to the direction of [110] or [110].

There is generated the misfit dislocation in the impurity-injected region which is not enclosed by the impurity-blocked region 4-6. On the contrary, nowhere is the misfit dislocation in the impurity-injected region 4-8 enclosed by the impurity-blocked region 4-6 and by the etched area 4-7 of the silicon wafer. Thus, there is provided a superior impurity-injected layer.

As described hereinbefore, the present invention is distinguished by a characteristic method comprising formation of an impurity-blocked region in a silicon wafer, thereby producing a high density impurity-injected layer, free of misfit dislocation, in the silicon wafer. In accordance with the present invention, there can be provided a junction wafer with high reliability, improved surface roughness, and superior electrical and mechanical properties.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for the prevention of misfit dislocation in a silicon wafer, comprising the steps of:

depositing a blanket silicon oxide or silicon nitride on silicon wafer in a chemical vapor deposition process;

subjecting the silicon oxide or silicon nitride to selective etch, to form a silicon oxide or silicon nitride pattern which is of closed, continuous perimeter shape; and injecting the silicon wafer with impurities at a high density with the CVD silicon oxide or silicon nitride pattern serving as a mask, to form an impurity-blocked region under the CVD silicon oxide or silicon nitride through the action of the mask, the impurity-blocked region forming a portion of the silicon wafer therewithin, whereby the misfit dislocation cannot be propagated from the edge of the silicon wafer into the portion enclosed by the impurity-blocked region.

2. A method for the prevention of misfit dislocation in a silicon wafer, comprising the steps of:

depositing a blanket silicon oxide or silicon nitride on silicon wafer in a chemical vapor deposition process;

subjecting the silicon oxide or silicon nitride to selective etch to expose an area of the silicon wafer which is of closed, continuous perimeter shape;

etching the exposed area of the silicon wafer by use of a chemical etchant, to form a closed, continuous perimeter groove in the silicon wafer;

selectively etching the remaining silicon oxide or silicon nitride by use of a mask, to form a silicon oxide or silicon nitride pattern which is of closed, continuous perimeter shape, along the closed, continuous perimeter groove; and injecting impurities at a high density into the silicon wafer with the silicon oxide or silicon nitride pattern serving as a mask, so as to form an impurity-blocked region under the silicon oxide or silicon nitride through the action of the mask, the impurity-blocked region forming a portion of the silicon wafer therewith;

whereby the misfit dislocation cannot be propagated from the edge of the silicon wafer into the portion enclosed by the impurity-blocked region.

3. A method for the prevention of misfit dislocation in the silicon wafer, comprising the steps of:

depositing a blanket silicon oxide or silicon nitride on silicon wafer in a chemical vapor deposition process;

subjecting the silicon oxide or silicon nitride to selective etch to expose an area of the silicon wafer which is of closed, continuous perimeter shape;

etching the exposed area of the silicon wafer with a chemical etchant to form a closed, continuous perimeter groove in the silicon wafer;

eliminating the remaining silicon oxide or silicon nitride completely;

depositing another blanket silicon oxide or silicon nitride over the silicon wafer in a chemical vapor deposition process;

selectively etching the silicon oxide or silicon nitride by use of a mask, to form a silicon oxide or silicon nitride pattern which covers an area including the closed, continuous perimeter groove; and injecting impurities at a high density into the silicon wafer with the silicon oxide or silicon nitride pattern serving as a mask, so as to form an impurity-blocked region under the silicon oxide or silicon nitride through the action of the mask, the impurity-blocked region forming a portion of the silicon wafer therewithin;

whereby the misfit dislocation cannot be propagated from the edge of the silicon wafer into the portion enclosed by the impurity-blocked region.

* * * * *